US012772779B2

(12) United States Patent
Rastegar

(10) Patent No.: US 12,772,779 B2
(45) Date of Patent: Oct. 20, 2026

(54) PHOTO-EMITTING PLASMA FOR ACTIVATION IN PROCESSING CHAMBERS, AND RELATED APPARATUS AND METHODS

(71) Applicant: Applied Materials, Inc., Santa Clara, CA (US)

(72) Inventor: Abbas Rastegar, Schenectady, NY (US)

(73) Assignee: Applied Materials, Inc., Santa Clara, CA (US)

( * ) Notice: Subject to any disclaimer, the term of this patent is extended or adjusted under 35 U.S.C. 154(b) by 369 days.

(21) Appl. No.: 18/526,976

(22) Filed: Dec. 1, 2023

(65) Prior Publication Data

US 2025/0183066 A1 Jun. 5, 2025

(51) Int. Cl.
*H01L 21/67* (2006.01)
*C23C 16/48* (2006.01)
(Continued)

(52) U.S. Cl.
CPC ........ *H10P 72/0436* (2026.01); *C23C 16/482* (2013.01); *C23C 16/50* (2013.01);
(Continued)

(58) Field of Classification Search
CPC .. H10P 72/0436; H10P 72/00; H10P 72/0441; H10P 72/0468; H10P 14/24;
(Continued)

(56) References Cited

U.S. PATENT DOCUMENTS 9,754,791 B2 * 9/2017 Godet .................... H10P 14/432
11,981,999 B2 * 5/2024 Carlson ................. C23C 16/482
(Continued)

FOREIGN PATENT DOCUMENTS

CN 112424389 A 2/2021
JP 2009194018 A 8/2009
WO 2024064161 A1 3/2024

OTHER PUBLICATIONS

PCT Search Report and Written Opinion dated Feb. 28, 2025 re: PCT Applicatin No. PCT/US2024/056139.
(Continued)

*Primary Examiner* — Nikolay K Yushin
(74) *Attorney, Agent, or Firm* — Patterson + Sheridan, LLP

(57) ABSTRACT

The present disclosure relates to photo-emitting plasma for gas activation in processing chambers, and related apparatus and methods. In one or more embodiments, a processing chamber applicable for semiconductor manufacturing includes one or more sidewalls, a window at least partially defining an internal volume, and a substrate support disposed in the internal volume. The processing chamber includes one or more heat sources operable to heat the internal volume, and a plate disposed in the internal volume and between the window and the substrate support. The plate at least partially separates the internal volume into a first volume between the plate and the substrate support, and a second volume between the plate and the window. The processing chamber includes an energy source operable to supply a plasma between the plate and the window.

15 Claims, 7 Drawing Sheets

(51) Int. Cl.

| | |
|---|---|
| ***C23C 16/50*** | (2006.01) |
| ***H01J 61/20*** | (2006.01) |
| ***H01L 21/02*** | (2006.01) |
| ***H01L 21/285*** | (2006.01) |
| ***H10P 14/24*** | (2026.01) |
| ***H10P 14/40*** | (2026.01) |
| ***H10P 14/60*** | (2026.01) |
| ***H10P 72/00*** | (2026.01) |

(52) U.S. Cl.
CPC .............. *H01J 61/20* (2013.01); *H10P 14/24* (2026.01); *H10P 14/40* (2026.01); *H10P 14/6336* (2026.01)

(58) Field of Classification Search
CPC ...... H10P 14/40; H10P 14/6336; H10P 14/60; H01J 37/32; H01J 37/34; H01J 37/32522; H01J 37/3244; H01J 61/20; H01J 37/32091; H01J 37/3056; H01J 37/321; C23C 16/482; C23C 16/48; C23C 16/50; C23C 16/45587; C23C 16/455; C30B 25/105; C30B 25/186; C30B 25/52
See application file for complete search history.

(56) References Cited

U.S. PATENT DOCUMENTS

| | | | | |
|---|---|---|---|---|
| 12,374,531 | B2 * | 7/2025 | Jung | H01J 37/32348 |
| 2007/0062645 | A1 | 3/2007 | Fukuchi | |
| 2012/0190207 | A1 | 7/2012 | Nishimura et al. | |
| 2015/0270148 | A1 * | 9/2015 | Shinoda | H01J 37/32724 156/345.35 |
| 2016/0233100 | A1 * | 8/2016 | Godet | H10P 14/432 |
| 2022/0102119 | A1 * | 3/2022 | Jung | H01J 37/32348 |
| 2022/0162756 | A1 * | 5/2022 | Carlson | C23C 16/482 |

OTHER PUBLICATIONS

Article; APL Photonics 2. 041302 (2017); 25 W of average power at 172 nm in the vacuum ultraviolet from flat, efficied lamps driven by interlaced arrays of microcavity plasmas; S. J-. Park; C.M. Herring; A.E. Mironov; J.G. Eden.
Artcie; Commericialization for VUV photolithography and nanopattering, disinfection of drinking water and air, and biofilm deactivation for medical therapeutics; Authors J. Kim, A.E. Mironov, J. H. Cho, D,S, Dievers, C.M. Herring, S. Park, P.P. Sun, Z. Liang, W. Chen, S.-J. Park, J.G. Eden published by Wiley-VCH GmbH; Plasma Processes and Polymers, 2022; 19:e2200075.
Article; Optical Silica Glass; Tosoh SGM USA, Inc.
Article; Kinetics of Hydrolysis of CaF2; Low-temperature-silicon-epitaxy; R.G. Frieser; vol. 115, No. 4.

* cited by examiner

PHOTO-EMITTING PLASMA FOR ACTIVATION IN PROCESSING CHAMBERS, AND RELATED APPARATUS AND METHODS

BACKGROUND

Field

The present disclosure relates to photo-emitting plasma for gas and/or surface activation in processing chambers, and related apparatus and methods.

Description of the Related Art

Semiconductor substrates are processed for a wide variety of applications, including the fabrication of integrated devices and microdevices. During processing, various parameters can affect the uniformity of material deposited on the substrate. For example the substrate temperature can affect gas activation, which can hinder deposition uniformity and deposition efficacy. Additionally, it can be difficult to use relatively low substrate temperatures for processing operations.

Therefore, a need exists for improved chamber components that facilitate temperature uniformities.

SUMMARY

The present disclosure relates to photo-emitting plasma for gas and/or surface activation in processing chambers, and related apparatus and methods.

In one or more embodiments, a processing chamber applicable for semiconductor manufacturing includes one or more sidewalls, a window at least partially defining an internal volume, and a substrate support disposed in the internal volume. The processing chamber includes one or more heat sources operable to heat the internal volume, and a plate disposed in the internal volume and between the window and the substrate support. The plate at least partially separates the internal volume into a first volume between the plate and the substrate support, and a second volume between the plate and the window. The processing chamber includes an energy source operable to supply a plasma between the plate and the window.

In one or more embodiments, a processing chamber applicable for semiconductor manufacturing includes one or more sidewalls, a window at least partially defining an internal volume, and a substrate support disposed in the internal volume. The processing chamber includes a plate disposed in the internal volume and between the window and the substrate support, and an energy source disposed between the plate and the window. The energy source is operable to emit ultraviolet (UV) light having a wavelength within a range of 100 nm to 355 nm.

In one or more embodiments, a method of substrate processing includes heating a substrate positioned on a substrate support, and supplying a plasma in an internal volume of the processing chamber. The supplying includes applying a voltage across the gas. The method includes flowing one or more process gases over the substrate, and depositing one or more layers on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to photo-emitting plasma for gas and/or surface activation in processing chambers, and related apparatus and methods. In one or more embodiments, the plasma is supplied within a processing chamber and the plasma emits ultraviolet (UV) light toward one or more of a substrate or one or more process gases. In one or more embodiments, the plasma is fluidly isolated from the one or more process gases that flow over the substrate.

Figure 1:
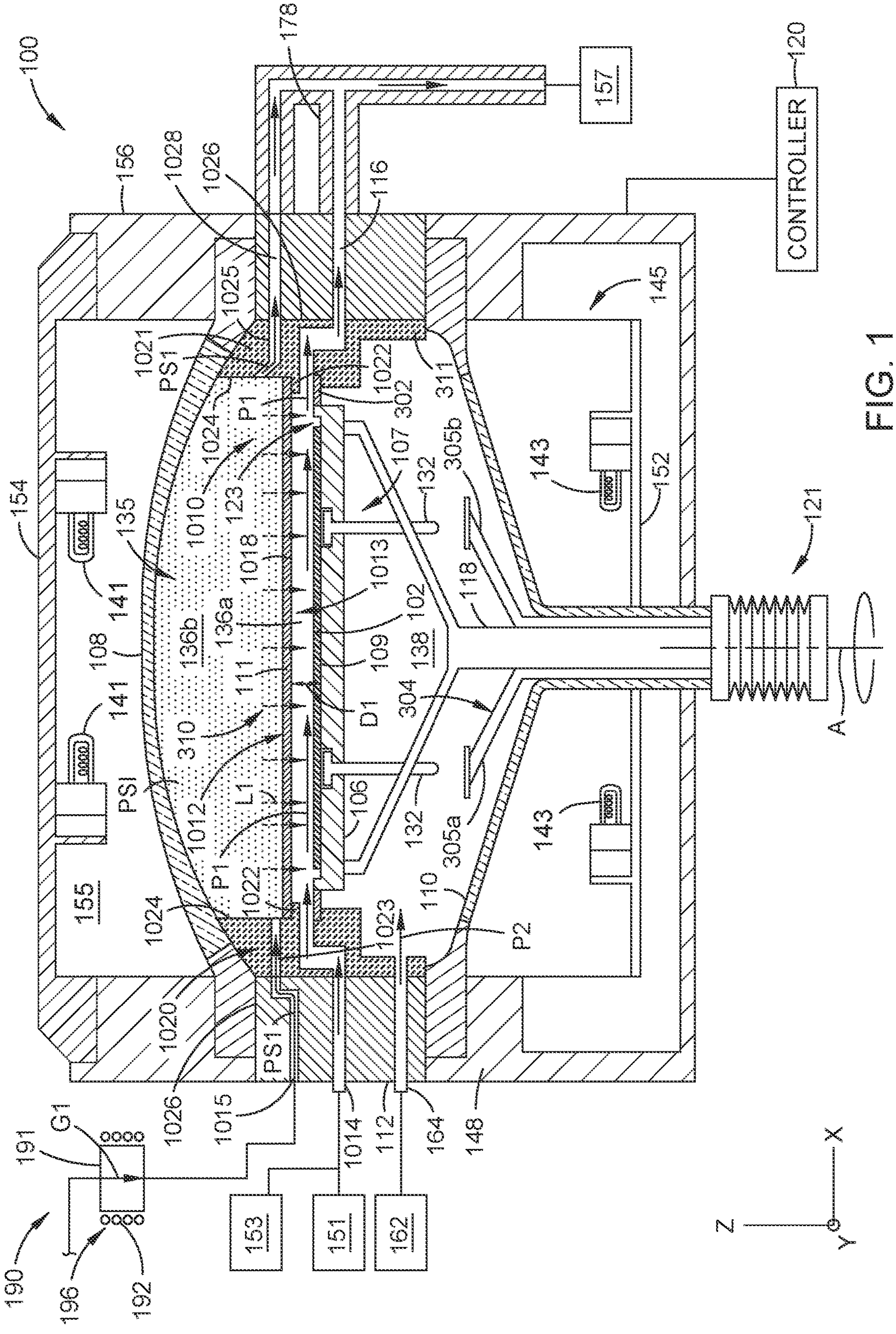
FIG. 1 is a schematic side cross-sectional view of a processing chamber, according to one or more embodiments.

FIG. 1 is a partial schematic side cross-sectional view of a processing chamber 100, according to one or more embodiments. The processing chamber 100 is a deposition chamber. In one or more embodiments, the processing chamber 100 is an epitaxial deposition chamber. In one or more embodiments, the processing chamber 100 is utilized to grow an epitaxial film on a substrate 102. The processing chamber 100 creates a cross-flow of precursors across a top surface of the substrate 102. The processing chamber 100 is shown in a processing condition in FIG. 1.

The processing chamber 100 includes an upper body 156, a lower body 148 disposed below the upper body 156, and a flow module 112 disposed between the upper body 156 and the lower body 148. The upper body 156, the flow module 112, and the lower body 148 form a chamber body. Disposed within the chamber body is a substrate support 106, an upper window 108 (such as an upper dome), a lower window 110 (such as a lower dome), and one or more heat sources 141, 143. In one or more embodiments, the one or more heat sources 141, 143 include a plurality of upper heat sources 141 and a plurality of lower heat sources 143. As shown, a controller 120 is in communication with the processing chamber 100 and is used to control processes and methods, such as the operations of the methods (for example the method 800 shown in FIG. 8) described herein. The present disclosure contemplates that each of the heat sources described herein can include one or more of: lamp(s) (such as infrared radiation lamps and/or plasma lamps), resistive heater(s), light emitting diode(s) (LEDs), and/or laser(s). The present disclosure contemplates that other heat sources can be used. In the implementation shown in FIG. 1, the heat sources 141, 143 are shown as lamps.

The substrate support 106 is disposed between the upper window 108 and the lower window 110. The substrate support 106 includes a support face 123 that supports the substrate 102. The plurality of upper heat sources 141 are disposed between the upper window and a lid 154. The plurality of upper heat sources 141 form a portion of the upper heat source module 155. The lid 154 may include a plurality of sensors disposed therein or thereon for measuring temperature(s) within the processing chamber 100. The plurality of lower heat sources 143 are disposed between the lower window 110 and a floor 152. The plurality of lower heat sources 143 form a portion of a lower heat source module 145. In one or more embodiments, the upper window 108 is an upper dome and is formed of an energy transmissive material, such as quartz. In one or more embodiments, the lower window 110 is a lower dome and is formed of an energy transmissive material, such as quartz. A pre-heat ring 302 is disposed outwardly of the substrate support 106. The pre-heat ring 302 is supported on a ledge of the lower liner 311. A stop 304 includes a plurality of arms 305*a*, 305*b* that each include a lift pin stop on which at least one of the lift pins 132 can rest when the substrate support 106 is lowered (e.g., lowered from a process position to a transfer position).

The upper window 108, the lower window 110, and the chamber body at least partially define an internal volume 135. The internal volume 135 has the substrate support 106 disposed therein. The substrate support 106 includes a top surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106.

The substrate support 106 may include lift pin openings 107 disposed therein. The lift pin openings 107 are sized to accommodate a lift pin 132 for lifting of the substrate 102 from the substrate support 106 either before or after a deposition process is performed.

A process kit 1010 disposed in the processing chamber 100 includes a plate 111 having a first outer face 1012 and a second outer face 1013 opposing the first outer face 1012. The plate 111 can be flat (as shown in FIG. 1) or another shape, such as curved. The second outer face 1013 faces the substrate support 106. The process kit 1010 includes an upper liner 1020. The upper liner 1020 includes an annular section 1021. The upper liner 1020 includes one or more inlet openings 1023 extending to an inner surface 1024 of the annular section 1021 on a first side of the upper liner 1020, and one or more outlet openings 1025 extending to the inner surface 1024 of the annular section 1021 on a second side of the upper liner 1020.

The one or more inlet openings 1023 and the one or more outlet openings 1025 extend from an outer surface 1026 of the annular section 1021 of the upper liner 1020 to the inner surface 1024.

In one or more embodiments, the plate 111 is in the shape of a disc, and the annular section 1021 is in the shape of a ring. It is contemplated that the plate 111 and/or the annular section 1021 can be in the shape of a rectangle, or other geometric shapes. The plate 11 can be flat (as shown in FIG. 1) or can be another shape, such as curved or tapered. The plate 111 at least partially separates the internal volume 135 into a first volume 136*a* (e.g., a lower volume) between the plate 111 and the substrate support 106, and a second volume 136*b* (e.g., an upper volume) between the plate 111 and the upper window 108. In one or more embodiments, the plate 111 is a plate 111 that at least partially fluidly isolates (such as partially or entirely fluidly isolates) the second volume 136*b* from the first volume 136*a*. In one or more embodiments, the plate 111 includes a transparent material. In one or more embodiments, the transparent material includes transparent quartz. Other materials may be used, such as one or more of lithium fluoride (LiF), magnesium fluoride ($MgF_2$), calcium difluoride ($CaF_2$), and/or other materials. In one or more embodiments, the plate 111 has a transmissivity of at least 50% for light having a wavelength within a range of 120 nm to 150 nm. In one or more embodiments, the plate 111 has a transmissivity of at least 80% for light having a wavelength that is 150 nm or higher. The transmission can be higher for a wavelength above 170 nm.

The flow module 112 (which can define at least part of one or more sidewalls of the processing chamber 100) includes one or more first inlet openings 1014 in fluid communication with the first volume 136*a* of the internal volume 135. The flow module 112 includes one or more second inlet openings 1015 in fluid communication with the second volume 136*b* of the internal volume 135. The one or more first inlet openings 1014 are in fluid communication with one or more flow gaps between the upper liner 1020 and the lower liner 311. The one or more second inlet openings 1015 are in fluid communication with the one or more inlet openings 1023 of the upper liner 1020. The first inlet openings 1014 are fluidly connected to one or more process gas sources 151 and one or more cleaning gas sources 153. The purge gas inlet(s) 164 are fluidly connected to one or more purge gas sources 162. One or more gas exhaust outlets 116 and one or more second gas exhaust outlets 1028 are fluidly connected to an exhaust pump 157. One or more process gases supplied using the one or more process gas sources 151 can include one or more reactive gases (such as one or more of silicon-containing, phosphorus-containing, and/or germanium-containing gases, and/or one or more carrier gases (such as one or more of nitrogen (N2) and/or hydrogen (H2)). One or more purge gases supplied using the one or more purge gas sources 162 can include one or more inert gases (such as one or more of argon (Ar), helium (He), and/or nitrogen (N2)). One or more cleaning gases supplied using the one or more cleaning gas sources 153 can include one or more of hydrogen and/or chlorine. In one or more embodiments, the one or more process gases include silicon phosphide (SiP) and/or phospine (PH3), and the one or more cleaning gases include hydrochloric acid (HCl).

The processing chamber 100 includes an energy source 190. In one or more embodiments, the energy source 190 includes a remote plasma source (RPS) 196 and the one or more second inlet openings 1015 are fluidly connected to the RPS. The RPS 196 may generate a plasma PS1 outside of the internal volume 135 and flow the plasma PS1 to the second volume 136*b*. The RPS 196 of the energy source 190 includes a flow housing 191 and a series of radio frequency coils 192 (RF coils) wound at least partially around the flow housing 191. The plasma PS1 can be generated by flowing a gas G1 through the flow housing 191 and supplying electrical power to the series of RF coils 192 to ionize the gas G1 and generate the plasma PS1. The gas G1 used to generate plasma PS1 may include but are not limited to one or more of xenon ($Xe_2$), fluorine ($F_2$), krypton fluoride ($Kr_2$), neon ($Ne_2$), helium ($H_2$), argon ($Ar_2$), bromine ($Br_2$), chlorine ($Cl_2$), iodine ($I_2$), and/or any mixtures thereof (such as xenon and neon, or krypton fluoride). Other materials are contemplated for the gas G1 to generate the plasma PS1. The plasma PS1 flows from the RPS 196 of the energy source 190 and into the upper volume 136*b* through the one or more second inlet openings 1015 and the one or more inlet openings 1023 of the upper liner 1020. The plasma PS1 may then flow out of the one or more outlet openings 1025, through the one or more second gas exhaust outlets 1028, and into an exhaust system 178.

The one or more gas exhaust outlets 116 and the one or more second gas exhaust outlets 1028 are fluidly connected to the exhaust system 178. The exhaust system 178 fluidly connects the one or more gas exhaust outlets 116 and the one or more second gas exhaust outlets 1028 to the exhaust pump 157. The exhaust system 178 can assist in the controlled deposition of a layer on the substrate 102. The exhaust system 178 is disposed on an opposite side of the processing chamber 100 relative to the flow module 112. The present disclosure contemplates that one or more purge gases P2 can be supplied to the purge volume 138 (through the plurality of purge gas inlets 164) during a deposition operation, and exhausted from the purge volume 138. The exhaust system 178 can control the exhausting of the plasma PS1, the one or more process gases P1, and/or one or more purge gases P2.

In one or more embodiments, as shown in FIG. 1, the one or more inlet openings 1023 are oriented in a horizontal orientation and the one or more outlet openings 1025 are oriented in a partially angled orientation. The present disclosure contemplates that the one or more inlet and/or outlet openings 1023, 1025 can be oriented in a horizontal orientation, oriented in an angled (e.g., non-parallel to horizontal) orientation, and/or can include one or more turns (such as the turns shown for the one or more first inlet openings 1014 and the one or more gas exhaust outlets 116).

During a deposition operation (e.g., an epitaxial growth operation), the one or more process gases P1 flow through the one or more first inlet openings 1014, through the one or more gaps, and into the first volume 136*a* of the internal volume 135 to flow over the substrate 102. During the deposition operation, the plasma PS1 flows through the one or more second inlet openings 1015, through the one or more inlet openings 1023 of the upper liner 1020, and into the second volume 136*b* of the internal volume 135. The one or more purge gases P2 flow simultaneously with the flowing of the one or more process gases P1 and the plasma PS1. While the plasma PS1 resides in the second volume 136*b*, the plasma PS1 emits light L1. In one or more embodiments, the light L1 is ultraviolet (UV) light. The light L1 is emitted upon one or more of the substrate 102, the substrate support 106, the pre-heat ring 302, and/or the one or more process gases P1 to facilitate activation of the one or more process gases P1. The activation enhances processing operations (such as deposition and/or cleaning). For example, the flowing of the plasma PS1 through the second volume 136*b* facilitates enhanced gas activation of the one or more process gases P1, increased film growth rates on the substrate 102, and enhanced deposition uniformity. The one or more process gases P1 are exhausted through gaps between the upper liner 1020 and the lower liner 311, and through the one or more gas exhaust outlets 116. The plasma PS1 is exhausted through the one or more outlet openings 1025 and through the one or more second gas exhaust outlets 1028. Additionally or alternatively, the one or more outlet openings 1025 can be fluidly connected to the one or more gas exhaust outlets 116, and the plasma PS1 can be exhausted through the same gaps between the upper liner 1020 and the lower liner 311, and through the same one or more gas exhaust outlets 116 as the one or more process gases P1. The present disclosure contemplates that that one or more purge gases P2 can be separately exhausted through the same one or more gas exhaust outlets 116 or through one or more third gas exhaust outlets that are separate from the one or more gas exhaust outlets 116.

As described, the energy source 190 is operable to generate the plasma PS1 to emit the light L1 (e.g., UV light). A wavelength of the light L1 (e.g., UV light) emitted by the plasma PS1 is within a range of 100 nm to 355 nm. In one or more embodiments, the wavelength is within a range of 150 nm to 250 nm, such as within a range of 150 nm to 200 nm. In one or more embodiments, the wavelength of the light L1 is within a range of 169 nm to 175 nm. In one or more embodiments, the wavelength of the light L1 is within a range of 171.5 nm to 172.5 nm, such as about 172 nm. The light L1 emitted by the plasma PS1 propagates through the plate 111 and onto one or more of the substrate 102, the one or more process gases P1, the pre-heat ring 302, and/or the substrate support 106 to activate the one or more process gases P1 when target temperatures below 500 degrees Celsius are used. In one or more embodiments, the substrate 102 is heated to a target temperature of 500 degrees Celsius or less during the processing. The substrate 102 may be heated by the light L1 in combination with heating from the upper heat sources 141 and/or the lower heat sources 143. In one or more embodiments, a support surface 109 of the substrate support 106 is disposed at a distance D1 of 20 mm or less from a lower surface 1018 of the plate 111. In one or more embodiments, the distance D1 is within a range of 5 mm to 20 mm. The lower surface 1018 can be part of the second outer face 1013. The distance D1 facilitates enhanced gas activation and reduced interference with the flow of the one or more process gases P1.

During processing, in one or more embodiments, the substrate 102 is heated to a target temperature of less than 500 degrees Celsius. In one or more embodiments, the target temperature for the substrate 102 is 400 degrees Celsius or less. In one or more embodiments, the target temperature for the substrate 102 is within a range of 380 degrees Celsius to less than 500 degrees Celsius, such as within a range of 400 degrees Celsius to less than 500 degrees Celsius.

Figure 2:
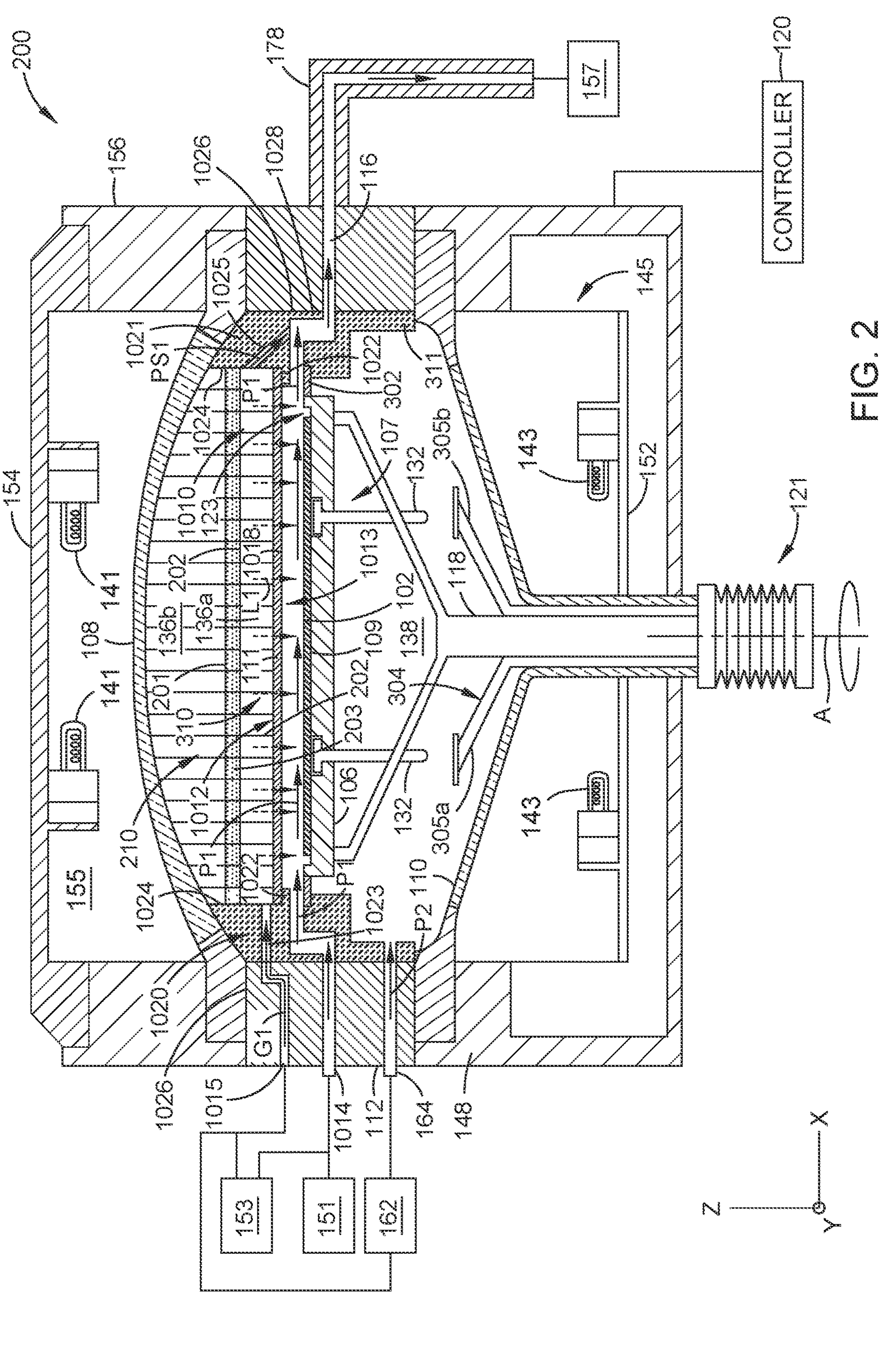
FIG. 2 is a partial schematic side cross-sectional view of a processing chamber, according to one or more embodiments.

FIG. 2 is a partial schematic side cross-sectional view of a processing chamber 200, according to one or more embodiments. The processing chamber 200 is similar to the processing chamber 100 shown in FIG. 1, and includes one or more of the aspects, features, components, properties, and/or operations thereof. The processing chamber 200 is shown in a processing condition in FIG. 2.

The processing chamber 200 includes an energy source 210 disposed in the second volume 136*b*. The energy source 210 includes an array of electrodes 201, 202 disposed in the second volume 136*b*. The array of electrodes 201, 2022 at least partially define a plurality of flow openings 203 (e.g., microcavities) between the electrodes 201, 202. In the implementation shown in FIG. 2, the gas G1 that otherwise flows through the flow housing 191 in FIG. 1 flows into the second volume 136*b* and into the flow openings 203. Using the electrodes 201, 202 a voltage is generated across the flow openings 203 by flowing a current (such as an RF current) through the gas in the flow openings 203. The current energizes the gas in the flow openings 203 and generates a plasma PS1 that emits the light L1. Individual flow openings 203 and/or groups of flow openings 203 may be controlled independently from one another so that different flow openings 203 or groups of flow openings 203 generate a UV light emitting plasma at different intensities and/or different wavelengths. By controlling the flow openings 203 independently, the substrate 102 may be exposed to different intensities and wavelengths of UV lights along different areas on a surface of the substrate 102, which can adjust processing uniformity (e.g., deposition uniformity) at different areas of the substrate 102.

Figure 3:
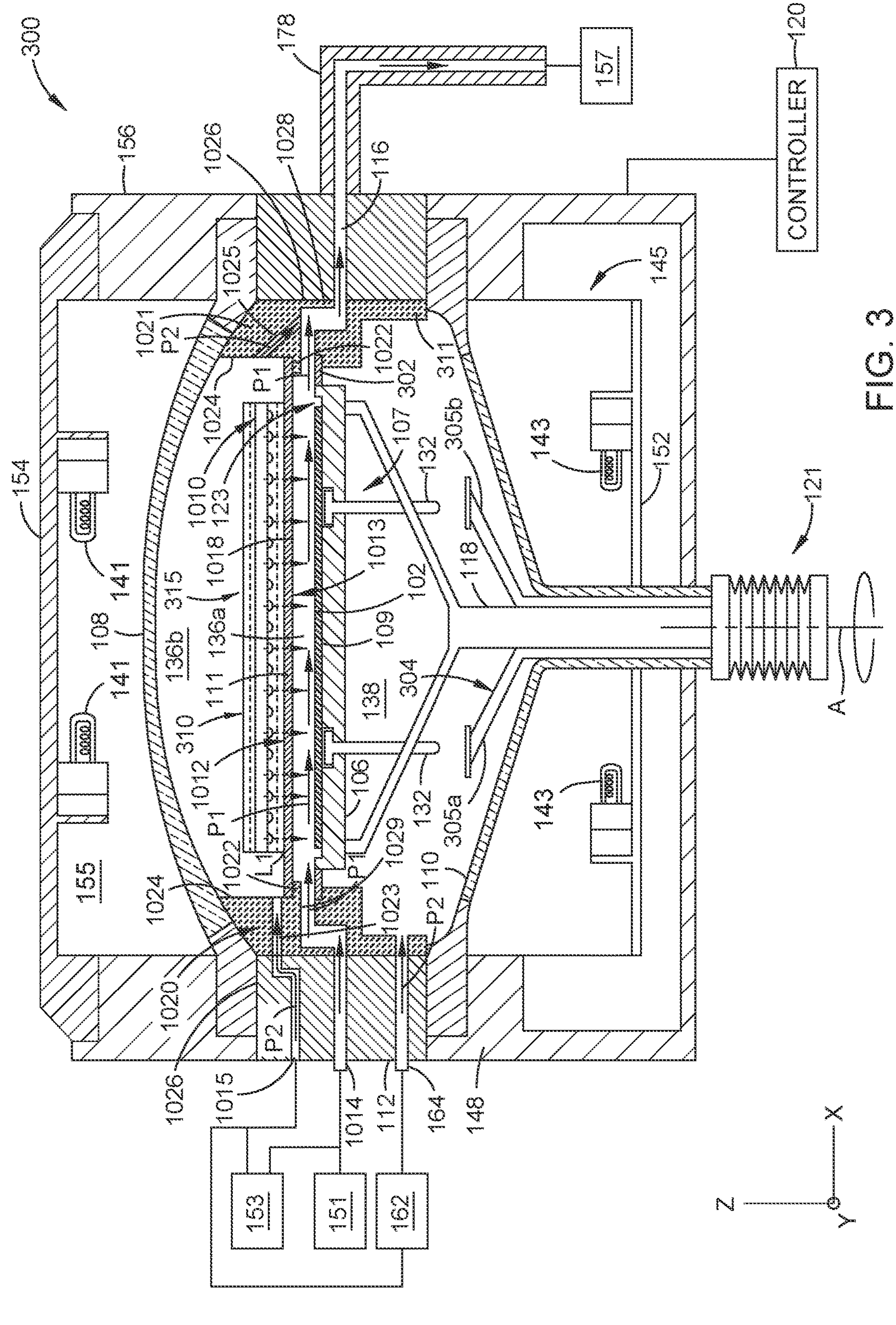
FIG. 3 is a partial schematic side cross-sectional view of a processing chamber, according to one or more embodiments.

FIG. 3 is a partial schematic side cross-sectional view of a processing chamber 300, according to one or more embodiments. The processing chamber 300 is similar to the processing chamber 100 shown in FIG. 1, and includes one or more of the aspects, features, components, properties, and/or operations thereof. The processing chamber 300 is shown in a processing condition in FIG. 3.

Figure 7:
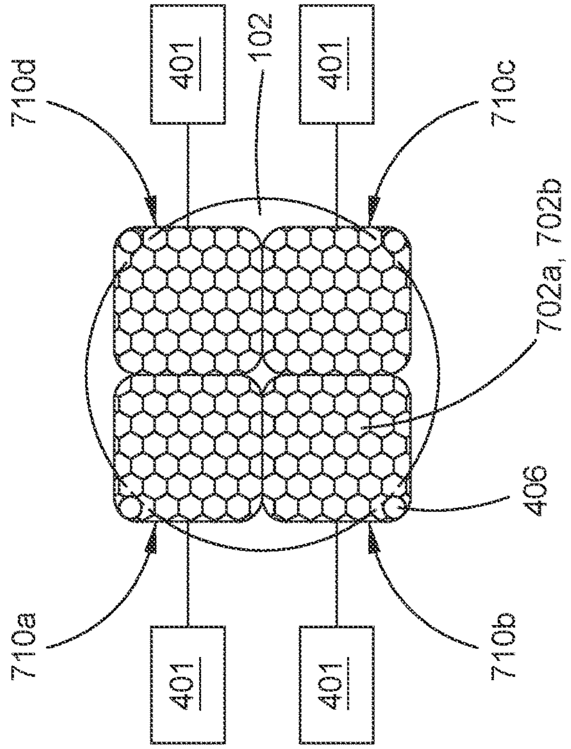
FIG. 7 is a schematic partial top view of a plurality of lamps, according to one or more embodiments.
Figure 6:
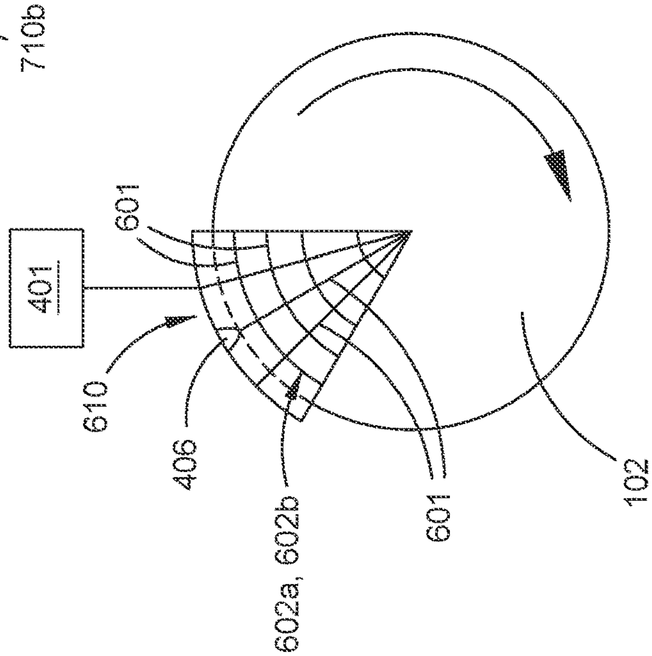
FIG. 6 is a schematic partial top view of a plasma lamp, according to one or more embodiments.

The processing chamber 300 includes an energy source 310. The energy source 310 includes one or more plasma lamps 315 disposed in the second volume 136*b*. In one or more embodiments, the one or more plasma lamps 315 are supported on the plate 111. In one or more embodiments, the one or more plasma lamps 331 are discal in shape. It is contemplated that the one or more plasma lamps 331 be in the shape of a rectangle, or other geometric shapes. The one or more plasma lamps 331 may be aligned with an azimuthal section of the substrate support 106 and/or the substrate 102 (as shown in FIG. 6, described below). There may be an array of plasma lamps aligned respectively with a plurality of sections of the substrate support 106 and/or the substrate 102 (as shown in FIG. 7, described below). The one or more plasma lamps 311 may be any kind of lamp known to produce a UV light including mercury lamps, xenon lamps, neon lamps, helium lamps, as well as any other lamp that may produce a UV light. In one or more embodiments, the one or more plasma lamps 311 include bulbs, rods, tubes, electrodes, microcavities, or any other chamber that can contain a gas that can be ignited into a plasma to emit UV light.

Figure 4:
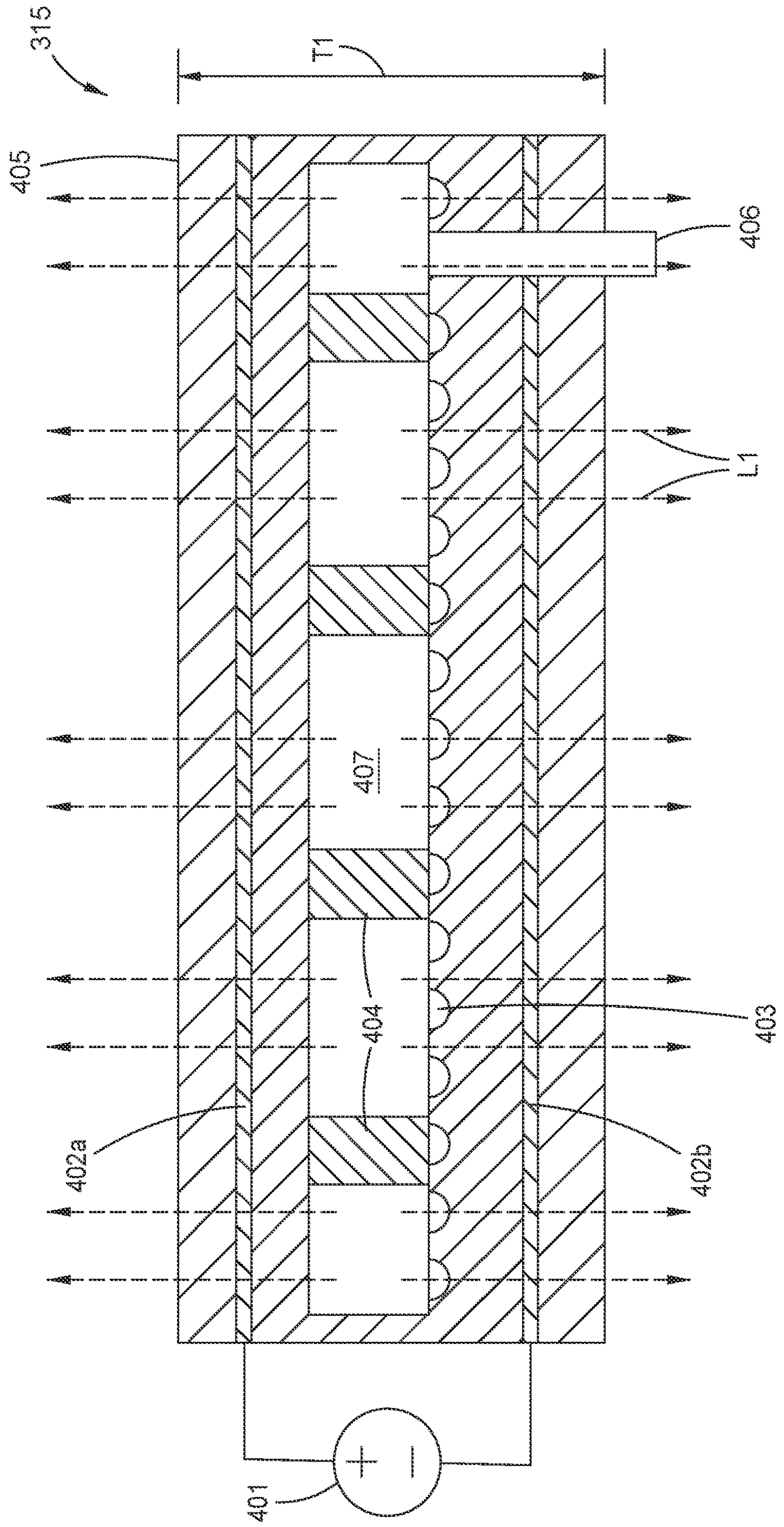
FIG. 4 is a schematic enlarged cross-sectional view of one of the one or more plasma lamps shown in in FIG. 3, according to one or more embodiments.

FIG. 4 is a schematic enlarged cross-sectional view of one of the one or more plasma lamps 315 shown in FIG. 3, according to one or more embodiments. The plasma lamp 315 includes a power supply 401, an array of electrodes 402*a*, 402*b* (a pair is shown), a plurality of cavities 403 (e.g., microcavities), a plurality of spacers 404, a plurality of transparent window sections 405, and a tube 406. The tube 406 is sealed and filled with the gas G1. In one or more embodiments, the transparent window sections 405 include quartz, such as fused silica. The cavities 403 are aligned between the electrodes 402, 402*b*.

The array of electrodes 402*a*, 402*b* are operable (e.g., by flowing a current, such as an RF current, through the power supply 401) to generate a voltage across the plurality of cavities 403. The electric current travels through the plasma lamp 315 from a first electrode 402*a* to a second electrode 402*b*. The gas G1 (which can include one or more of xenon ($Xe_2$), Neon ($Ne_2$), Helium ($He_2$) fluorine ($F_2$), argon ($Ar_2$), bromine ($Br_2$), chlorine ($Cl_2$), iodine ($I_2$), krypton ($Kr_2$), and/or any mixtures of the thereof). As described above, other materials are contemplated for the gas G1 is disposed in an inner volume 407 of the lamp 315. The inner volume 407 is in fluid communication with the cavities 403 and the tube 406. The inner volume 407 is surrounded by the transparent window sections 405 that are spaced at least partially from each other by the spacers 404. As the current passes through plasma lamp 315, the voltage is applied across the gas G1 and the gas G1 is energized and generate the plasma PS1 that emits the light L1 (e.g., the UV light). The light L1 emits through the transparent window sections 503. The transparent window sections 405 may have varying transmissivities and/or refractive indices to affect the intensity and/or wavelength of light L1 that is reflected by or transmitted through the transparent window sections 405. The electrodes 402*a*, 402*b* can be used to measure an impedance of the plasma PS1.

In one or more embodiments, the power supply 401 of the plasma lamp 315 supplies an average power within a range of 20 W to 30 W, such as about 25 W. In one or more embodiments, the power supply 401 supplies a peak power of over 600 W. In one or more embodiments, a thickness T1 of the plasma lamp 315 is less than 10 mm, such as 6 mm or less.

Figure 5:
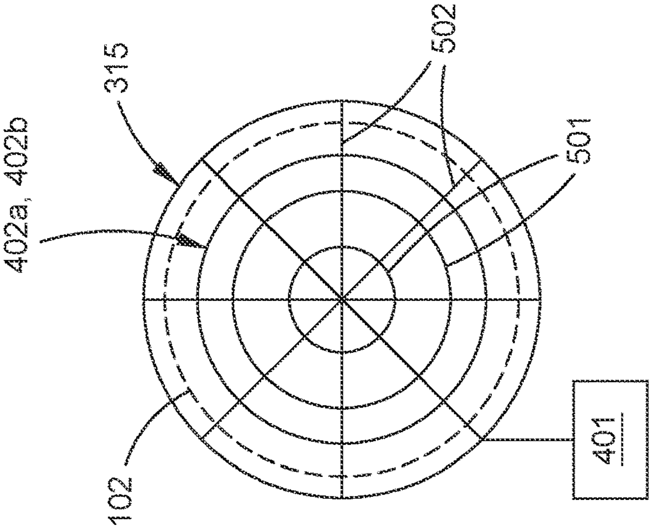
FIG. 5 is a schematic partial top view of the plasma lamp shown in FIG. 4, according to one or more embodiments.

FIGS. 5-7 are schematic partial top views of plasma lamps 315, 610, 710 above the substrate 102 shown in FIG. 3. Other various parts of the processing chamber 3000 such as the plate 111 are not shown in FIGS. 5-7 for visual clarity purposes.

FIG. 5 is a schematic partial top view of the plasma lamp 315 shown in FIG. 4, according to one or more embodiments. The plasma lamp 315 is operable to emit light L1 (e.g., UV light) that spans an entirety of an upper surface of the substrate 102 during processing. The plasma lamp 315 may have a circular shape (e.g., a discal shape). The present disclosure contemplates that other apparatus and methods of generating plasma described herein (such as the energy source 190 and/or the energy source 210) can be used to emit light L1 spanning the entirety of the upper surface of the substrate 102. A dimension (such as a diameter) of the plasma lamp can be higher than a dimension (such as a diameter) of the substrate 102. The first electrode 402*a* and/or the second electrode 402*b* include a plurality of arcuate (e.g., circular) sections 501 and a plurality of radial section 502 intersecting each other. In one or more embodiments, the arcuate sections 501 are concentric to each other at differing radii. In one or more embodiments, the first electrode 402*a* and/or the second electrode 402*b* include a mesh. In one or more embodiments, the plasma lamp 315 is a sealed lamp that seals therein the gas G1 and the electrodes 402*a*, 402*b*. An intensity of the plasma generated in the plasma lamp 315 can be controlled (e.g., adjusted) by controlling the voltage applied to the electrodes 40*a*, 402*b*. As such, an intensity of the generated light L1 can be controlled (e.g., adjusted) by controlling the voltage applied to the electrodes 402*a*, 402*b*.

FIG. 6 is a schematic partial top view of a plasma lamp 610, according to one or more embodiments. The plasma lamp 610 is operable to emit the light L1 to span a section (such as an azimuthal section) of the upper surface of the substrate 102 during processing. The present disclosure contemplates that other apparatus and methods of generating plasma described herein (such as the energy source 190 and/or the energy source 210) can be used to emit light L1 spanning the portion of the upper surface of the substrate 102. The substrate 102 can be rotated during processing such that the portion is scanned across the entirety of the upper surface of the substrate 102. The substrate 102 may be rotated at varying speeds in order to determine how parts of the substrate 102 are exposed to the light L1 emitted by the plasma lamp 610. The plasma lamp 610 may be shaped like a sector of a circle (e.g., pie-shaped). The plasma lamp 610 includes a first electrode 602*a* and a second electrode 602*b*. A dimension (such as a radius) of the plasma lamp can be lower than a dimension (such as a diameter) of the substrate 102. The first electrode 602*a* and/or the second electrode 602*b* include a plurality of arcuate (e.g., arc) sections 601 and a plurality of radial section 603 intersecting each other. In one or more embodiments, the first electrode 602*a* and/or the second electrode 602*b* include a mesh.

FIG. 7 is a schematic partial top view of a plurality of plasma lamps 710*a*-710*d*, according to one or more embodiments. Each respective plasma lamp 710*a*-710*d* emits the light L1 (e.g., light) that span respective portions of the upper surface of the substrate 102. Each plasma lamp 710*a*-710*d* can be controlled independently to emit the light L1. For example, the plasma lamps 710*a*-710*d* can be independently turned on and off. As another example, the plasma lamps 710*a*-710*d* can independently emit light L1 having different intensities and/or different wavelengths that span different areas of the upper surface of the substrate 102. The lamps 710*a*-710*d* can be independently controlled, for example, by respectively controlling an amplitude of the RF current, a value of the voltage across the gas G1, and/or an amount of gas G1 for individual lamps 710*a*-710*d*.

The plurality of lamps 710*a*-710*d* are shown as rectangular in shape. The plurality of plasma lamps 710*a*-710*d* may be other geometric shapes such as discal, hexagonal, and octagonal. Other geometric shapes are contemplated. Any number of plasma lamps may be placed above the substrate 102, such as one plasma lamp (as shown in FIGS. 5 and 6), two plasma lamps, three plasma lamps, four plasma lamps (as shown in FIG. 7), five plasma lamps, six plasma lamps, or another number of plasma lamps.

A first electrode 702*a* and/or a second electrode 702*b* of each lamp 710*a*-710*d* include a plurality of sections 701 intersecting each other. The sections 701 form a grid, such as a honeycomb grid. The sections 701 are hexagonal in shape. Other geometric shapes (such as circles) are contemplated for the sections 701. In one or more embodiments, the first electrode 702*a* and/or the second electrode 702*b* include a mesh.

Figure 8:
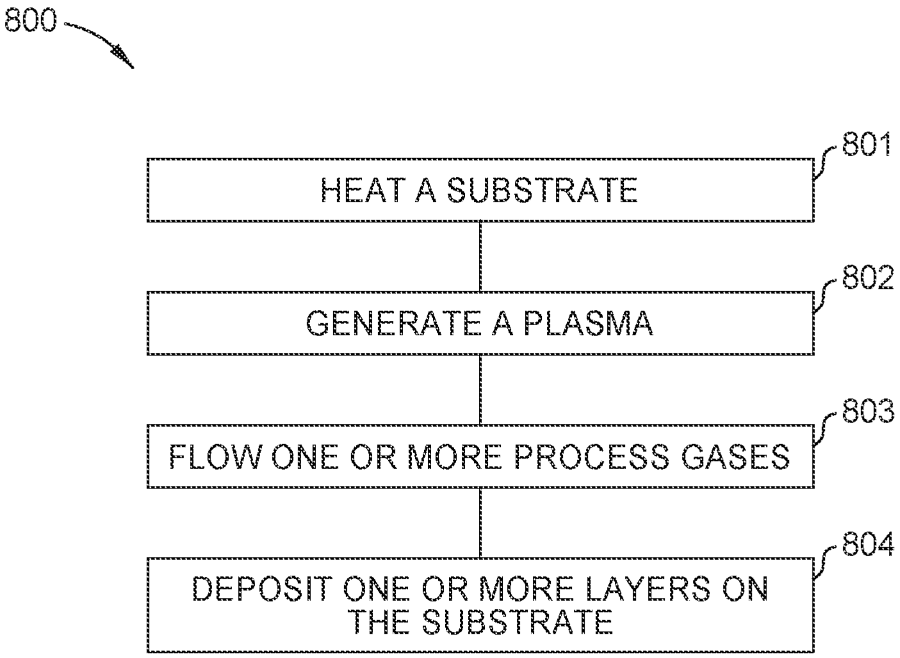
FIG. 8 depicts a flow chart describing a method of processing a substrate in a processing chamber, according to one or more embodiments.

FIG. 8 is a schematic flow chart of a method 800 of substrate processing, according to one or more embodiments. The method 800 can be conducted in relation to any of the previously described processing chambers 100, 200, or 300, or other processing chambers.

Operation 801 includes heating a substrate positioned on a substrate support. In one or more embodiments, the substrate is heated to a target temperature that is 500 degrees Celsius or less.

Operation 802 includes supplying a plasma in an internal volume of a processing chamber. The plasma may be generated, for example, in a variety of manners as described for example in relation to process chambers 100, 200, or 300. For example, the plasma may be generated by the RPS 196 shown in FIG. 1, and flowed to the second volume 136*b*. As another example, the plasma may be generated in the second volume 136*b* using the series of flow openings 203 (e.g., cavities) shown in FIG. 2. As a further example, the plasma may be generated using one or more of the plasma lamps 315, 610, 710*a*-710*d* shown in FIGS. 3-7. The supplying of the plasma includes applying a voltage across a gas (such as the gas G1). The voltage can be constant (using, using direct current (DC)) or varied. For example, the voltage can be varied with respect to amplitude, frequency, and/or phase. The voltage can be pulsed. The pulsing can use variable frequency. The gas can be flowing or can be contained in a volume. In one or more embodiments, the applied voltage is within a range of 10V to 5000V. The amount of the applied voltage can vary based, for example, on the distance between the electrodes, a composition of the gas, and a pressure of the gas.

Operation 803 includes flowing one or more process gasses over the substrate. In one or more embodiments the plasma in the internal volume is fluidly isolated from the one or more process gases by a plate. The plasma of operation 802 emits UV light toward one or more of the substrate, the substrate support, or the one or more process gases. For example, at operation 802 the UV light can be emitted toward the substrate to activate surface(s) of the substrate prior to the flowing of the one or more process gases at operation 803. Prior to operation 802, one or more cleaning gases (such as hydrogen ($H_2$)) can flow, and the UV light of operation 802 can activate the one or more cleaning gases (e.g., to generate hydrogen radicals) to pre-clean the surface(s) of the substrate prior to operation 803. The pre-cleaning can remove contaminants from the substrate.

Operation 804 includes depositing one or more layers on an upper surface of a substrate. The one or more layers can be formed as the one or more process gases are flowed over the substrate. The plasma supplied at operation 802 can be resident in the processing before, during, and/or after the depositing of the one or more layers. As an example, the plasma can be supplied to remove (e.g., burn off) materials (such as organic materials and/or carbon) in the processing chamber and/or on the substrate.

Figure 9:
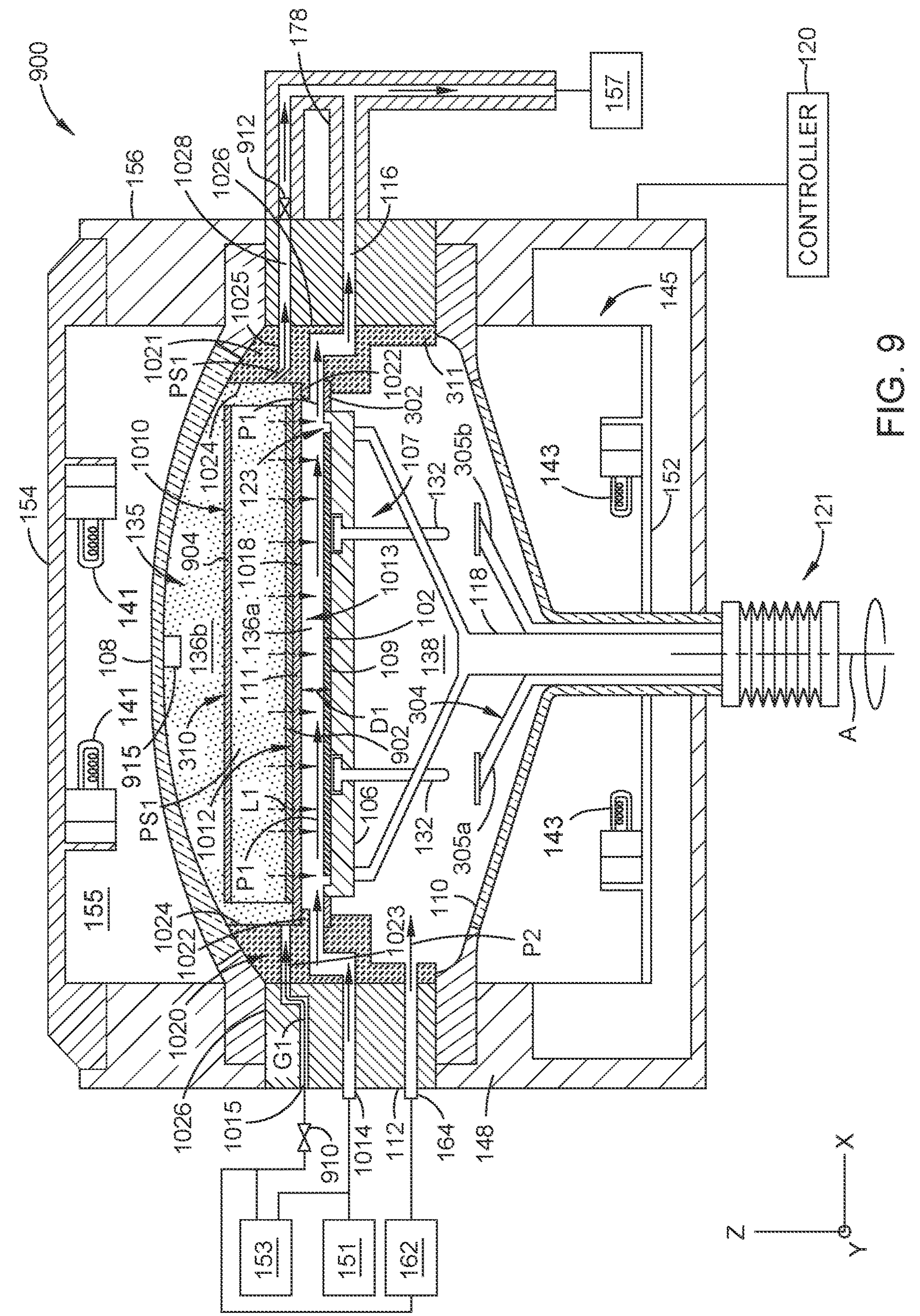
FIG. 9 is a partial schematic side cross-sectional view of a processing chamber, according to one or more embodiments.

FIG. 9 is a partial schematic side cross-sectional view of a processing chamber 900, according to one or more embodiments. The processing chamber 900 is similar to the processing chamber 100 shown in FIG. 1, and includes one or more of the aspects, features, components, properties, and/or operations thereof. The processing chamber 200 is shown in a processing condition in FIG. 2.

The second volume 136*b* of the processing chamber 900 is filled with the gas G1, and an array of electrodes 902, 904 are disposed in the second volume 136*b*. The gas G1 is sealed into the second volume 136*b* during processing, and the electrodes 902, 904 can apply the voltage to the gas G1 to ignite the plasma PS1. An inlet valve 910 and an outlet valve 911 are in fluid communication with the second volume 136*b* and can be used to supply the gas G1 into the second volume 136*b* and exhaust the gas G1 from the second volume 136*b*. For example, during machine downtime the outlet valve 911 can be opened to exhaust the gas G1 from the second volume 136*b*, and after maintenance is conducted the inlet valve 910 can be opened (with the outlet valve 9111 closed) to re-fill the second volume 136*b* with the gas G1. One or more sensors 915 (such as one or more pressure sensors) are operable to measure a parameter (such as pressure) of the gas G1 in the second volume 136*b*.

Benefits of the present disclosure include enhanced gas activation, increased film growth rates, and enhanced deposition uniformity, such as for low temperature deposition operations that use low target temperatures for substrates. Such benefits can be facilitated, for example, for complementary field-effect transistor (CFET) operations. As an example, UV light having a wavelength within a range of 150 nm to 250 nm facilitates gas activation. Benefits also containing and directing the light L1 toward one or more of the substrate 102, the substrate support 106, the pre-heat ring 302, and/or the one or more process gases P1 for gas activation, which facilitates the high energy photons of the light L1 being absorbed by one or more of the substrate 102, the substrate support 106, the pre-heat ring 302, and/or the one or more process gases P1.

It is contemplated that one or more aspects disclosed herein may be combined. As an example, one or more aspects, features, components, operations and/or properties of the processing chamber 100, processing chamber 200, processing chamber 300, controller 120, the energy source 190, the energy source 210, the energy source 310, the plasma lamp(s) 315, the plasma lamp 610, the plasma lamps 710*a*-710*d*, the method 800, and/or the processing chamber 900 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A processing chamber applicable for semiconductor manufacturing, comprising:
- one or more sidewalls;
- a window at least partially defining an internal volume;
- a substrate support disposed in the internal volume;
- one or more heat sources operable to heat the internal volume;
- a plate disposed in the internal volume and between the window and the substrate support, the plate at least partially separating the internal volume into:
  - a first volume between the plate and the substrate support, and
  - a second volume between the plate and the window; and
- an energy source operable to supply a plasma between the plate and the window, wherein the energy source comprises an array of electrodes disposed in the second volume, the array of electrodes at least partially defining flow openings between the electrodes.

2. The processing chamber of claim 1, wherein the plate includes a transparent material, and the plate has a transmissivity of at least 80% for light having a wavelength that is 150 nm or higher.

3. The processing chamber of claim 1, wherein the energy source is operable to emit ultraviolet (UV) light having a wavelength within a range of 100 nm to 355 nm.

4. The processing chamber of claim 3, wherein the wavelength is within a range of 150 nm to 250 nm.

5. The processing chamber of claim 4, wherein the wavelength is within a range of 169 nm to 175 nm.

6. A processing chamber applicable for semiconductor manufacturing, comprising:
- one or more sidewalls;
- a window at least partially defining an internal volume;
- a substrate support disposed in the internal volume;
- a plate disposed in the internal volume and between the window and the substrate support; and
- an energy source disposed between the plate and the window, the energy source operable to emit ultraviolet (UV) light having a wavelength within a range of 100 nm to 355 nm, wherein the energy source comprises an array of electrodes and a plurality of cavities, and the array of electrodes are operable to generate voltage across the plurality of cavities.

7. A processing chamber applicable for semiconductor manufacturing, comprising:
- one or more sidewalls;
- a window at least partially defining an internal volume;
- a substrate support disposed in the internal volume;
- a plate disposed in the internal volume and between the window and the substrate support; and
- an energy source disposed between the plate and the window, the energy source operable to emit ultraviolet (UV) light having a wavelength within a range of 100 nm to 355 nm, wherein the energy source comprises a plasma lamp aligned with an azimuthal section of the substrate support.

8. A processing chamber applicable for semiconductor manufacturing, comprising:
- one or more sidewalls;
- a window at least partially defining an internal volume;
- a substrate support disposed in the internal volume;
- a plate disposed in the internal volume and between the window and the substrate support; and
- an energy source disposed between the plate and the window, the energy source operable to emit ultraviolet (UV) light having a wavelength within a range of 100 nm to 355 nm, wherein the energy source comprises a plurality of plasma lamps aligned respectively with a plurality of sections of the substrate support.

9. The processing chamber of claim 8, wherein the plurality of plasma lamps are supported on the plate.

10. The processing chamber of claim 9, wherein the plate includes a transparent material, and the plate has a transmissivity of at least 80% for light having a wavelength that is 150 nm or higher.

11. A processing chamber applicable for semiconductor manufacturing, comprising:
- one or more sidewalls;
- a window at least partially defining an internal volume;
- a substrate support disposed in the internal volume;
- a plate disposed in the internal volume and between the window and the substrate support; and
- an energy source disposed between the plate and the window, the energy source operable to emit ultraviolet (UV) light having a wavelength within a range of 100 nm to 355 nm;
- an inlet valve in fluid communication with a volume between the window and the plate;
- an outlet valve in fluid communication with the volume; and
- one or more sensors operable to measure a parameter in the volume.

12. A method of substrate processing, comprising:
- heating a substrate positioned on a substrate support;
- supplying a plasma in an internal volume of a processing chamber, the supplying comprising applying a voltage across a gas;
- flowing one or more process gases over the substrate; and
- depositing one or more layers on the substrate, wherein the plasma in the internal volume is fluidly isolated from the one or more process gases by a plate, the plasma emits ultraviolet (UV) light toward one or more of the substrate, the substrate support, or the one or more process gases, and the UV light has a wavelength within a range of 100 nm to 355 nm.

13. The method of claim 12, wherein the wavelength is within a range of 150 nm to 200 nm.

14. The method of claim 12, wherein a support surface of the substrate support is disposed at a distance of 20 mm or less from a lower surface of the plate.

15. The method of claim 12, wherein the substrate is heated to a target temperature below 500 degrees Celsius.

* * * * *